United States Patent [19]

Hugo et al.

[11] 4,278,919
[45] Jul. 14, 1981

[54] TELEVISION VERTICAL DEFLECTION CIRCUIT UTILIZING COMPARATORS

[75] Inventors: Rolf Hugo; Wilfried Schiller, both of Hildesheim, Fed. Rep. of Germany

[73] Assignee: Blaupunkt-Werke GmbH, Hildesheim, Fed. Rep. of Germany

[21] Appl. No.: 93,865

[22] Filed: Nov. 13, 1979

[30] Foreign Application Priority Data

Nov. 23, 1978 [DE] Fed. Rep. of Germany ....... 2850731

[51] Int. Cl.$^3$ ............................................... H01J 29/72
[52] U.S. Cl. ................................................. 315/393
[58] Field of Search ......................... 315/393, 408, 403

[56] References Cited

U.S. PATENT DOCUMENTS 4,048,544 8/1980 Haferl ................................. 315/408

Primary Examiner—Theodore M. Blum
Attorney, Agent, or Firm—Frishauf, Holtz, Goodman & Woodward

[57] ABSTRACT

The horizontal frequency control pulses of, respectively, increasing and decreasing pulse widths required by switches which control the transfer of energy from the horizontal output stage to the vertical deflection coils are furnished by a first and second comparator. Each of the comparators is a difference amplifier having an inverting and a direct input. The inverting input of the first comparator is connected only through a resistor to the output of a vertical frequency sawtooth generator and, similarly, only through a resistor, to the output of a stage which furnishes horizontal deflection frequency pulses having slanted pulse tops. The direct input of the second comparator is also connected, through a decoupling resistor only, to the output of the vertical sawtooth generator and, while its inverting input is connected to the output of the stage which furnishes the shaped horizontal frequency pulses. The direct input of the first comparator is connected to receive a DC voltage and to receive the output of a stage which furnishes positive vertical blanking pulses. To stabilize the height of the television picture, the voltage drop across a resistor in series with the vertical deflection coils is applied to the output of the vertical sawtooth generator, so that a negative feedback is provided.

6 Claims, 3 Drawing Figures

TELEVISION VERTICAL DEFLECTION CIRCUIT UTILIZING COMPARATORS

CROSS-REFERENCE TO RELATED APPLICATIONS AND PUBLICATIONS

U.S. Pat. No. 4,048,544 (Haferl) which is herein incorporated by reference into the present application.

The present invention relates to vertical deflection circuits in television receivers. In particular, it relates to synchronized switched vertical deflection apparatus.

BACKGROUND AND PRIOR ART

A synchronized switched vertical deflection circuit is shown in U.S. Pat. No. 4,048,544 which is hereby incorporated by reference into the present application. In this patent, first and second controllable switching stages are respectively connected between a source of horizontal retrace pulses and a capacitor connected across the vertical deflection windings. The currents through the two switching stages are of opposite polarity. One switching stage charges the capacitor in a first polarity with pulses of current of gradually decreasing amplitude and duration during a first portion of the vertical deflection interval and the other switching stage charges the capacitor in the opposite polarity with pulses of gradually increasing amplitude and duration during a second portion of the vertical deflection interval. The capacitor then supplies the required energizing current to the vertical deflection winding. In order that the two controllable switching stages operate as detailed above, the voltages applied to the control electrodes of the controllable switches must be varied accordingly. For this purpose, a two-channel multistage control circuit is provided. The output stage of each channel consists of a pulse width modulator, but at least one of the signals applied to the pulse width modulator must undergo a considerable amount of processing before being applied thereto.

THE INVENTION

It is an object of the present invention to furnish a circuit for supplying control pulses of, respectively, increasing and decreasing pulse widths to second and first controllable switch means of the above-described type, respectively. It is a particular object of the present invention to furnish such a circuit which is not sensitive to temperature, which has fewer components than the known circuit, and which is suitable for manufacture as an integrated circuit.

In accordance with the present invention, television equipment operative in vertical trace and retrace intervals occurring at a vertical deflection frequency and horizontal trace and retrace intervals occurring at a horizontal deflection frequency and having means for generating sawtooth voltage at said vertical deflection frequency, means for furnishing shaped horizontal frequency pulses having slanted pulse tops, vertical deflection means, and means for energizing said vertical deflection means, said energizing means comprising at least one controllable switch means requiring application of a sequence of horizontal control pulses having increasing pulse widths during each of said vertical deflection intervals is provided with apparatus for furnishing said sequence of horizontal frequency control pulses. The latter apparatus comprises comparator means, for example a difference amplifier, which has a first and second input and a comparator output and which furnishes comparator output pulses having pulse widths corresponding to the time a signal applied to said second input has an amplitude exceeding the amplitude of a signal applied to said first input. Means are provided for connecting the first input of the comparator means to the sawtooth voltage generating means and to the shaped pulse furnishing means. Finally, means are provided which connect the comparator output to the controllable switch means so that the comparator output signals constitute the required horizontal frequency control pulses. The above constitutes the equipment for the first channel. For the second channel, a comparator is also provided and one of its inputs (the direct or non-inverting input) is connected to the output of the vertical sawtooth voltage generator through a resistor only, while its second input is similarly connected to the horizontal frequency shaped pulse generator.

To stabilize the height of the television picture, a resistor is connected in series with the vertical deflection coils and the voltage across the resistor is applied as a negative feedback voltage to the input of the comparators receiving the vertical frequency sawtooth voltages.

In a particularly preferred embodiment of the invention, the energy for the vertical deflection coils is derived from the horizontal deflection frequency output stage. The controllable switch means, e.g. thyristors, have anode-cathode voltages, which are so controlled that the thyristors can become conductive during the line retrace interval only. Since, at the anode of one of the thyristors, a vertical blanking voltage adds to the horizontal deflection frequency voltage during the vertical retrace interval, a certain cut-off of the thyristor is assured by connection of the non-inverting input of the first-mentioned comparator to the output of a stage which furnishes positive vertical frequency blanking pulses. The output of the comparator then includes a corresponding pulse which assures certain blocking of the thyristor.

It should be noted that, since the output of the vertical sawtooth generator is connected to the inputs of the comparators only through resistors and not through further processing stages, the present invention results in a considerable saving of electronic components and units. Such components and units tend to have tolerances in their various electrical characteristics which cause a great deal of effort to be required for proper matching to decrease variations in the height of the television picture. Further, the circuit of the present invention is particularly suitable for manufacture as an integrated circuit.

DESCRIPTION OF THE PREFERRED EMBODIMENT

Figure 1:
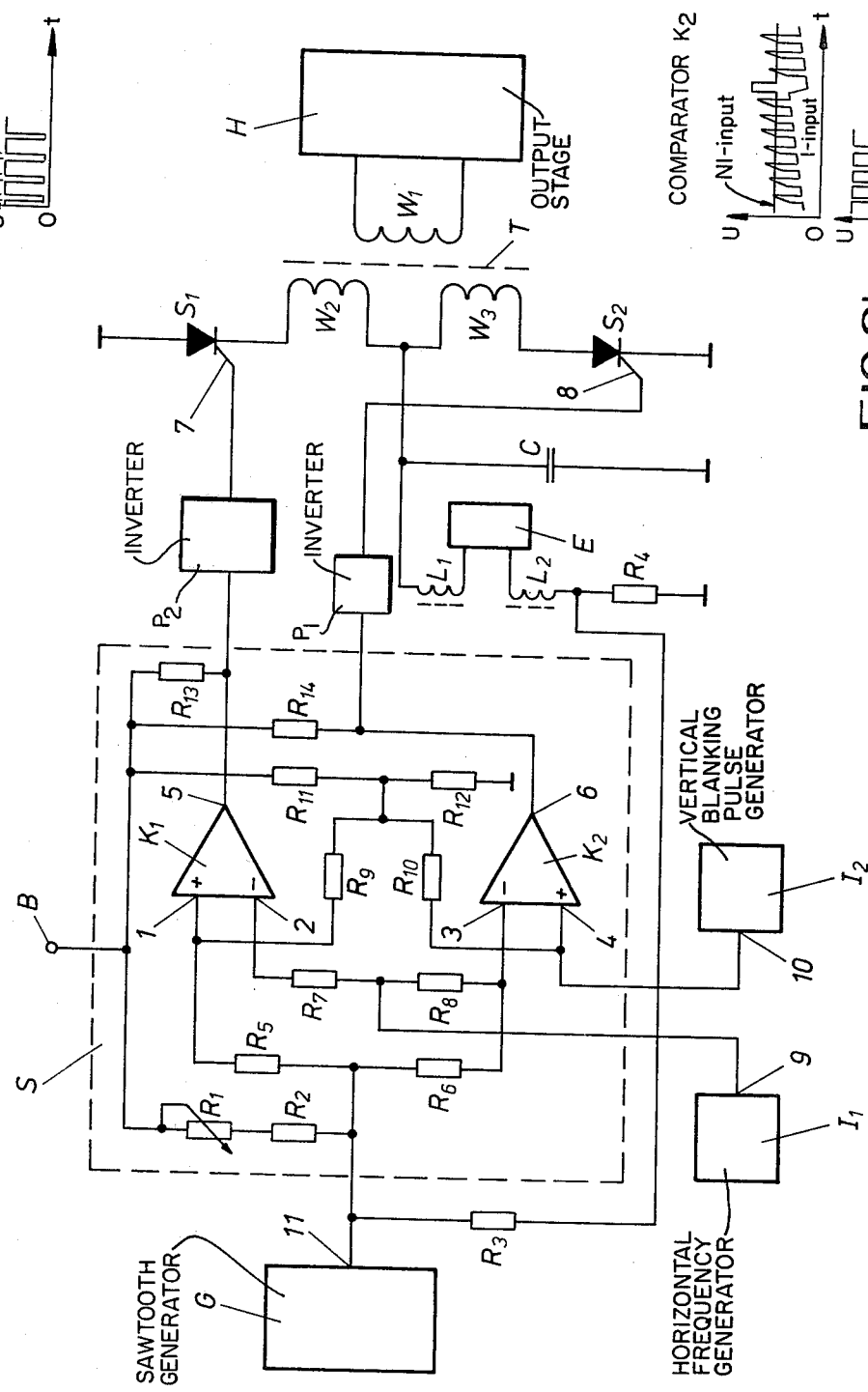
FIG. 1 shows a vertical deflection circuit according to the present invention, partially in block form.

FIG. 1 is a circuit diagram, partially in block form, of a vertical deflection circuit according to the present invention.

The vertical deflection circuit shown in FIG. 1 has a horizontal output stage H to which is connected the primary winding W1 of the horizontal output transformer T. The secondary windings W2 and W3 of transformer T provide the energy required for the vertical deflection of the electron beam of the cathode ray tube (not shown).

A sawtooth generator G operative at the vertical deflection frequency has an output terminal 11 at which is furnished a sawtooth voltage having no DC component. A pulse shaping stage $I_1$ furnishes horizontal retrace pulses having slanted pulse tops, as, for example, shown in FIG. 4a of U.S. Pat. No. 4,048,544.

Referring again to the FIG. 1, terminals 9 and 11 are both connected to a control stage S. Control stage S, in response to these two inputs, furnishes control pulses for a thyristor $S_1$ and a thyristor $S_2$. Specifically, the width of the control pulses controls the "on" time of each of the thyristors. The control pulses for thyristor $S_1$ decrease in pulse width during the vertical trace interval, while the control pulses for thyristor $S_2$ are of increasing width. The control pulses are horizontal frequency pulses whose pulse width is modulated by the vertical frequency sawtooth voltage furnished by sawtooth generator G.

The horizontal frequency pulses applied to thyristors $S_1$ and $S_2$ are of opposite polarity. The voltages across windings $W_2$ and $W_3$ are such that the thyristors can only become conductive during the line or horizontal retrace intervals. The currents flowing through thyristors $S_1$ and $S_2$ charge a capacitor C, so that a vertical frequency sawtooth shaped voltage of alternating polarity appears across the capacitor. The voltage across capacitor C drives current through the vertical deflection coils $L_1$ and $L_2$ and a correction circuit E which corrects geometric distortions and top-bottom distortion.

Control stage S which provides the control pulses for thyristors $S_1$ and $S_2$ consists mainly of two comparators $K_1$ and $K_2$. The vertical frequency output voltage of sawtooth generator G is applied through decoupling resistors $R_5$ and $R_6$ to the direct input, 1, of comparator $K_1$ and to the inverting input, 3, of comparator $K_2$. The horizontal frequency output pulses furnished by pulse forming stage $I_1$ are applied via decoupling resistors $R_7$ and $R_8$, respectively, to the inverting inputs 2 and 3 of comparators $K_1$ and $K_2$, respectively. The signals appearing at outputs 5 and 6 of comparators $K_1$ and $K_2$, respectively, are therefore the required pulse width modulated control pulses for thyristors $S_1$ and $S_2$. Resistors $R_9$ and $R_{10}$ decouple direct inputs 1 and 4 of comparators $K_1$ and $K_2$ from each other. Resistors $R_{11}$, $R_{12}$, $R_{13}$, and $R_{14}$ fix the operating points of control stage S, an operating voltage being applied to control stage S at a terminal B.

Vertical deflection coil $L_2$ is connected to ground potential via a resistor $R_4$ which has a relatively low resistance value. The voltage across resistors $R_4$ is applied through a resistor $R_3$ to the input of control stage S, which also receives the vertical sawtooth voltage furnished by vertical sawtooth generator G. The voltage across resistor $R_4$ is therefore a feedback voltage for control stage S.

A voltage divider consisting of a variable resistor $R_1$ and fixed resistors $R_2$, $R_3$, and $R_4$ fixes the vertical position of the picture on the cathode ray tube. This vertical position can be altered by changing the adjustment of resistor $R_1$.

As a result of the above-described application of signals to the direct and inverting inputs of comparators $K_1$ and $K_2$, pulse width modulated control pulses of horizontal frequency appear at outputs 5 and 6 of comparators $K_1$ and $K_2$. The control pulses appearing at the gate 7 of thyristor $S_1$ are broad at the beginning of the vertical trace interval and then decrease in width, while the horizontal frequency pulses at the output of comparator $K_2$, that is the pulses controlling gate 8 of thyristor $S_2$, are narrow at the start of the vertical trace interval and then increase in width.

Figure 2A:
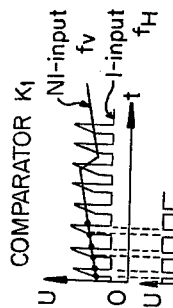
FIGS. 2a and 2b show wave forms at the inputs and outputs of the comparators of FIG. 1.
Figure 2B:
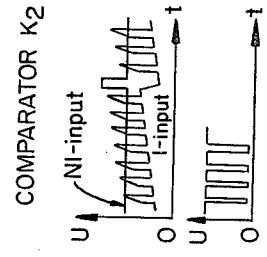

The signals at the inputs and outputs of comparators $K_1$ and $K_2$ are shown in FIGS. 2a and 2b, respectively. As shown in FIG. 2a, the vertical frequency sawtooth input, as it increases, intersects the horizontal frequency pulses with the slanted pulse tops at higher and higher portions of the latter, so that comparator $K_1$ furnishes narrower and narrower "0" output signals. These signals are applied to a phase inverter $P_1$ whose input is, in turn, connected to gate 7 of thyristor $S_1$. Thyristor $S_1$ will thus be conductive for continually decreasing time intervals till the end of the vertical trace interval.

As will be noted from FIG. 2b, the output pulses of comparator $K_2$ change in width in the opposite direction, that is they are very narrow at the start of the vertical trace interval and increase in width as the vertical trace interval progresses. These pulses, after inversion and amplification in an inverter $P_2$ are applied to the gate of thyristor $S_2$. Thyristor $S_2$ allows current flow for ever increasing intervals during the vertical retrace. The difference between the two currents, namely the currents controlled by thyristors $S_1$ and $S_2$, respectively, charges capacitor C. Specifically, at the start of the vertical trace interval, a positive charging current flows in capacitor C. This decreases and, at the end of the first half period becomes zero since the current of the two thyristors is then equal in amplitude but opposite in phase. At the end of the vertical trace interval the maximum negative current flows through capacitor C. The resultant voltage change across capacitor C causes the required sawtooth current to flow through the vertical deflection coils $L_1$, $L_2$.

Since a retrace voltage of vertical frequency is added to the horizontal frequency voltage applied to the anode of thyristor $S_2$, it is necessary to assure that thyristor $S_2$ will not become conductive during the vertical retrace interval. For this reason, a source of positive vertical blanking pulses, $I_2$, is connected to the direct (non-inverting) input 4 of comparator $K_2$. This pulse is illustrated in FIG. 2b. It causes thyristor $S_2$ to remain blocked during the vertical retrace or blanking time.

The source of horizontal frequency pulses, $I_1$, and sawtooth generator G can be used in known fashion to control the horizontal deflection apparatus.

Energy for the vertical deflection coils may be derived from the horizontal output stage either during the line retrace interval or during the line trace interval. The switches controlling the current flow may be either thyristors, or transistors, or any other appropriate controllable switch means. Further, it is intended that the invention encompass circuits in which the two inputs of the comparator circuits are interchanged. The comparators may, for example, be constructed as overdriven difference amplifiers.

Various changes and modifications may be made within the scope of the inventive concepts.

We claim:

1. In television equipment operative in vertical trace and retrace intervals occurring at a vertical deflection frequency and horizontal trace and retrace intervals occurring at a horizontal deflection frequency, said television equipment having means (G) for generating a sawtooth voltage at said vertical deflection frequency, means ($I_1$) for furnishing shaped horizontal frequency pulses having slanted pulse tops, vertical deflection means ($L_1$, $L_2$), and means ($S_1$, $S_2$, $W_2$, $W_3$, C) for energizing said vertical deflection means, said energizing means comprising at least one controllable switch means ($S_2$) requiring application of a sequence of horizontal frequency control pulses having increasing pulse width during each of said vertical deflection intervals, apparatus for furnishing said sequence of horizontal frequency control pulses, comprising comparator means ($K_2$) having a first (3) and a second (4) input and a comparator output (6) for furnishing comparator output pulses having pulse widths corresponding to the time a signal applied to said second input has an amplitude exceeding the amplitude of a signal applied to said first input;

first connecting means ($R_6$) for connecting said first input of said comparator means to said sawtooth voltage generating means;

second connecting means ($R_8$) for connecting said first input of said comparator means to said shaped horizontal frequency pulse furnishing means; and means interconnected between said comparator output and said controllable switch means for applying said comparator output pulses to said controllable switch means to constitute said sequence of horizontal frequency control pulses.

2. Television equipment as set forth in claim 1, wherein said comparator means comprises a difference amplifier having a direct and an inverting input; and wherein said first and second input constitute said inverting and said direct input, respectively.

3. Television equipment as set forth in claim 1, wherein said energizing means comprises first and second controllable switch means requiring application of a sequence of horizontal frequency control pulses having, respectively, increasing and decreasing pulse widths, during each of said vertical deflection intervals;

wherein said comparator means constitutes first comparator means having a first comparator output and furnishing first comparator output pulses;

further comprising second comparator means having a direct and an inverting input and a second comparator output for furnishing second comparator output pulses having pulse widths corresponding to the time a signal applied to said direct input has an amplitude exceeding the signal applied at said inverting input, means ($R_7$) for connecting said inverting input to said shaped pulse furnishing means, means ($R_5$) for connecting said direct input to said sawtooth voltage generating means, and means connected to said second comparator means and said second controllable switch means for applying said second comparator output pulses to said second controllable switch means to constitute said sequence of horizontal frequency control pulses having said decreasing pulse widths.

4. Television equipment as set forth in claim 3, wherein said vertical deflection means comprises at least one vertical deflection coil ($L_2$);

further comprising feedback means ($R_4$) connected to said vertical deflection coil, and third connecting means ($R_3$) for connecting said feedback means to said sawtooth voltage generating means.

5. Television equipment as set forth in claim 4, wherein said feedback means comprises a resistor.

6. Television equipment as set forth in claim 4, further comprising means ($I_2$) for furnishing vertical blanking pulses, and means for connecting said vertical blanking pulse furnishing means to said direct input of said first comparator means, whereby said second controllable switch means is reliably blocked during said vertical retrace intervals.

* * * * *